United States Patent
Chavez

(10) Patent No.: US 9,192,085 B2
(45) Date of Patent: Nov. 17, 2015

(54) SYSTEMS, METHODS AND APPARATUS FOR PLANAR EXPULSION SHIELDS

(75) Inventor: Patrick Pablo Chavez, Maple Ridge, CA (US)

(73) Assignee: D-Ware Systems Inc., Burnaby (CA)

( * ) Notice: Subject to any disclaimer, the term of this patent is extended or adjusted under 35 U.S.C. 154(b) by 669 days.

(21) Appl. No.: 13/615,075

(22) Filed: Sep. 13, 2012

(65) Prior Publication Data

US 2013/0190185 A1   Jul. 25, 2013

Related U.S. Application Data

(60) Provisional application No. 61/589,109, filed on Jan. 20, 2012.

(51) Int. Cl.
*H05K 9/00* (2006.01)
(52) U.S. Cl.
CPC ................................. *H05K 9/0077* (2013.01)
(58) Field of Classification Search
CPC .................................................. H05K 9/0077
See application file for complete search history.

(56) References Cited

U.S. PATENT DOCUMENTS

| | | | |
|---|---|---|---|
| 5,173,660 A * | 12/1992 | Marsden | 324/248 |
| 6,838,694 B2 | 1/2005 | Esteve et al. | |
| 7,335,909 B2 | 2/2008 | Amin et al. | |
| 7,533,068 B2 | 5/2009 | Maassen van den Brink et al. | |
| 7,619,437 B2 | 11/2009 | Thom et al. | |
| 7,687,938 B2 | 3/2010 | Bunyk et al. | |
| 8,190,548 B2 | 5/2012 | Choi | |
| 8,195,596 B2 | 6/2012 | Rose et al. | |
| 8,247,799 B2 * | 8/2012 | Bunyk et al. | 257/31 |
| 8,355,765 B2 * | 1/2013 | Uchaykin et al. | 505/211 |
| 8,441,330 B2 * | 5/2013 | Uchaykin | 335/301 |
| 2006/0147154 A1 | 7/2006 | Thom et al. | |
| 2006/0225165 A1 | 10/2006 | Maassen van den Brink et al. | |
| 2008/0238531 A1 | 10/2008 | Harris | |
| 2011/0022820 A1 | 1/2011 | Bunyk et al. | |
| 2011/0237442 A1 | 9/2011 | Uchaykin | |

OTHER PUBLICATIONS

Blatter et al., "Design aspects of superconducting-phase quantum bits," *Physical Review B* 63:174511-1-174511-9, 2001.
Choi, V., "Systems, Devices, and Methods for Analog Processing," U.S. Appl. No. 60/986,554, filed Nov. 8, 2007, 39 pages.
Friedman et al., "Quantum superposition of distinct macroscopic states," *Nature* 406:43-46, Jul. 6, 2000.

(Continued)

*Primary Examiner* — Colleen Dunn
(74) *Attorney, Agent, or Firm* — Seed IP Law Group PLLC

(57) ABSTRACT

A superconducting magnetic shielding system includes first and second planar superconducting shields respectively positioned above and below an environment to be shielded. The shields are each thermally coupled to a cold source at a respective thermalizing point. When the shields are cooled into the superconducting regime, they passively block magnetic fields via the Meissner Effect. Each shield may also be shaped to produce a smooth temperature gradient extending away from its thermalizing point; thus, as the shields are cooled, magnetic fields may be expelled away from the thermalizing point and, consequently, away from the environment to be shielded. A heater may also be provided opposite the thermalizing points to improve control of the temperature gradient.

19 Claims, 6 Drawing Sheets

(56) References Cited

OTHER PUBLICATIONS

Harris, R.G., "Systems, Devices, and Methods for Controllably Coupling Qubits," U.S. Appl. No. 12/017,995, filed Jan. 22, 2008, 33 pages.

Il'ichev et al., "Continuous Monitoring of Rabi Oscillations in a Josephson Flux Qubit," *Physical Review Letters* 91(9):097906-1-097906-4, week ending Aug. 29, 2003.

Maibaum et al., "Systems, Devices, and Methods for Analog Processing," U.S. Appl. No. 61/039,710, filed Mar. 26, 2008, 48 pages.

Makhlin et al., "Quantum-State Engineering with Josephson-Junction Devices," *Reviews of Modern Physics* 73(2):357-400, Apr. 2001.

Mooij et al., "Josephson Persistent-Current Qubit," *Science* 285:1036-1039, Aug. 13, 1999.

Nielsen et al., *Quantum Computation and Quantum Information*, Cambridge University Press, Cambridge, 2000, "7.8 Other implementation schemes," pp. 343-345.

Orlando et al., "Superconducting Persistent-Current Qubit," *Physical Review B* 60(22):15 398-15 413, Dec. 1, 1999.

Pobell, Matter and Methods at Low Temperatures, Springer-Verlag, Second Edition, 120-156, 1996, 47 pages.

Rose et al., "Systems, Devices, and Methods for Interconnected Processor Topology," U.S. Appl. No. 12/013,192, filed Jan. 11, 2008.

\* cited by examiner

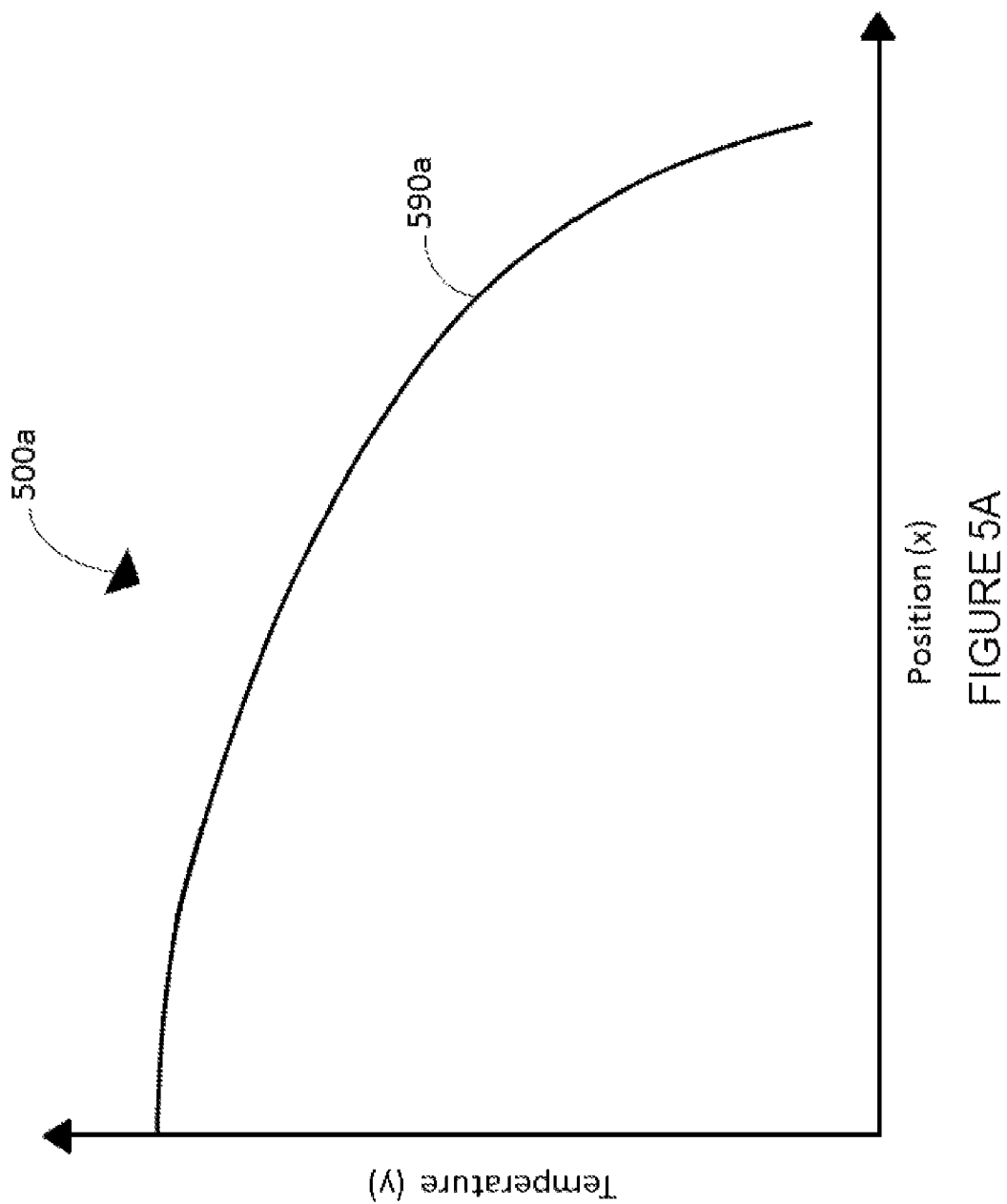

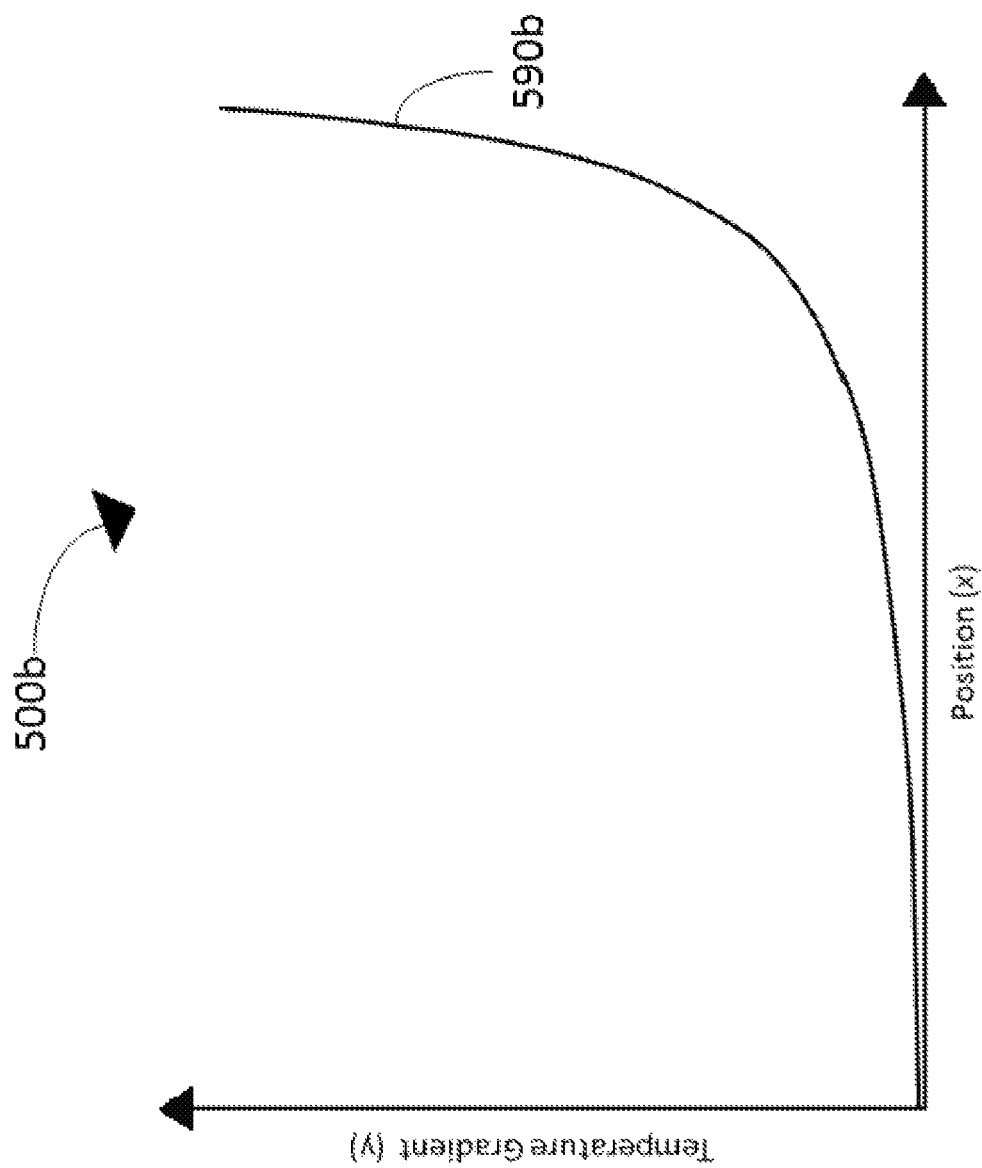

SYSTEMS, METHODS AND APPARATUS FOR PLANAR EXPULSION SHIELDS

CROSS REFERENCE TO RELATED APPLICATIONS

This application claims benefit under 35 U.S.C. 119(e) of U.S. Provisional Patent Application Ser. No. 61/589,109, filed Jan. 20, 2012, which is incorporated herein by reference in its entirety.

BACKGROUND

Field

The present systems, methods and apparatus generally relate to magnetic shielding and particularly relate to shielding a component of a magnetic field using planar expulsion shields.

Superconducting Qubits

There are many different hardware and software approaches under consideration for use in quantum computers. One hardware approach uses integrated circuits formed of superconducting materials, such as aluminum or niobium. The technologies and processes involved in designing and fabricating superconducting integrated circuits are similar in some respects to those used for conventional integrated circuits.

Superconducting qubits are a type of superconducting device that can be included in a superconducting integrated circuit. Superconducting qubits can be separated into several categories depending on the physical property used to encode information. For example, they may be separated into charge, flux and phase devices, as discussed in, for example Makhlin et al., 2001, *Reviews of Modern Physics* 73, pp. 357-400. Charge devices store and manipulate information in the charge states of the device, where elementary charges consist of pairs of electrons called Cooper pairs. A Cooper pair has a charge of 2e and consists of two electrons bound together by, for example, a phonon interaction. See e.g., Nielsen and Chuang, *Quantum Computation and Quantum Information*, Cambridge University Press, Cambridge (2000), pp. 343-345. Flux devices store information in a variable related to the magnetic flux through some part of the device. Phase devices store information in a variable related to the difference in superconducting phase between two regions of the phase device. Recently, hybrid devices using two or more of charge, flux and phase degrees of freedom have been developed. See e.g., U.S. Pat. Nos. 6,838,694 and 7,335,909.

Examples of flux qubits that may be used include rf-SQUIDs, which include a superconducting loop interrupted by one Josephson junction, or a compound junction (where a single Josephson junction is replaced by two parallel Josephson junctions), or persistent current qubits, which include a superconducting loop interrupted by three Josephson junctions, and the like. See e.g., Mooij et al., 1999, *Science* 285, 1036; and Orlando et al., 1999, *Phys. Rev. B* 60, 15398. Other examples of superconducting qubits can be found, for example, in Il'ichev et al., 2003, *Phys. Rev. Lett.* 91, 097906; Blatter et al., 2001, *Phys. Rev. B* 63, 174511, and Friedman et al., 2000, *Nature* 406, 43. In addition, hybrid charge-phase qubits may also be used.

The qubits may include a corresponding local bias device. The local bias devices may include a metal loop in proximity to a superconducting qubit that provides an external flux bias to the qubit. The local bias device may also include a plurality of Josephson junctions. Each superconducting qubit in the quantum processor may have a corresponding local bias device or there may be fewer local bias devices than qubits. In some embodiments, charge-based readout and local bias devices may be used. The readout device(s) may include a plurality of dc-SQUID magnetometers, each inductively connected to a different qubit within a topology. The readout device may provide a voltage or current. The dc-SQUID magnetometers including a loop of superconducting material interrupted by at least one Josephson junction are well known in the art.

Quantum Processor

A computer processor may take the form of an analog processor, for instance a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in at least US Patent Publication No. 2006-0225165 (now granted as U.S. Pat. No. 7,533,068), U.S. patent application Ser. No. 12/013,192 (now granted as U.S. Pat. No. 8,195,596), U.S. Provisional Patent Application Ser. No. 60/986,554 filed Nov. 8, 2007 and entitled "Systems, Devices and Methods for Analog Processing," and U.S. Provisional Patent Application Ser. No. 61/039,710, filed Mar. 26, 2008 and entitled "Systems, Devices, And Methods For Analog Processing."

A superconducting quantum processor may include a number of coupling devices operable to selectively couple respective pairs of qubits. Examples of superconducting coupling devices include rf-SQUIDs and dc-SQUIDs, which couple qubits together by flux. SQUIDs include a superconducting loop interrupted by one Josephson junction (an rf-SQUID) or two Josephson junctions (a dc-SQUID). The coupling devices may be capable of both ferromagnetic and anti-ferromagnetic coupling, depending on how the coupling device is being utilized within the interconnected topology. In the case of flux coupling, ferromagnetic coupling implies that parallel fluxes are energetically favorable and anti-ferromagnetic coupling implies that anti-parallel fluxes are energetically favorable. Alternatively, charge-based coupling devices may also be used. Other coupling devices can be found, for example, in US Patent Publication No. 2006-0147154 (now granted as U.S. Pat. No. 7,619,437) and U.S. patent application Ser. No. 12/017,995 (now published as US 2008-0238531 A1). Respective coupling strengths of the coupling devices may be tuned between zero and a maximum value, for example, to provide ferromagnetic or anti-ferromagnetic coupling between qubits.

Superconducting Processor

A computer processor may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting processors. Due to their natural physical properties, superconducting processors in general may be capable of higher switching speeds and shorter computation times than non-superconducting processors, and therefore it may be more practical to solve certain problems on superconducting processors.

Refrigeration

According to the present state of the art, a superconducting material may generally only act as a superconductor if it is cooled below a critical temperature that is characteristic of the specific material in question. For this reason, those of skill in the art will appreciate that a computer system that implements superconducting processors may implicitly include a refrigeration system for cooling the superconducting materials in the system. Systems and methods for such refrigeration systems are well known in the art. A dilution refrigerator is an example of a refrigeration system that is commonly implemented for cooling a superconducting material to a temperature at which it may act as a superconductor. In common practice, the cooling process in a dilution refrigerator may use a mixture of at least two isotopes of helium (such as helium-3 and helium-4). Full details on the operation of typical dilution refrigerators may be found in F. Pobell, *Matter and Methods at Low Temperatures,* Springer-Verlag Second Edition, 1996, pp. 120-156. However, those of skill in the art will appreciate that the present systems, methods and apparatus are not limited to applications involving dilution refrigerators, but rather may be applied using any type of refrigeration system.

BRIEF SUMMARY

A superconducting magnetic shielding system operable to shield a device from a component of a magnetic field, the device having at least a first surface and a second surface that is opposite the first surface, may be summarized as including a first planar shield formed of a material that is superconducting below a critical temperature, the first planar shield defined by a perimeter and an area that is larger than an area of the device; a second planar shield formed of a material that is superconducting below a critical temperature, the second planar shield defined by a perimeter and an area that is larger than the area of the device, wherein the first planar shield and the second planar shield are parallel with one another, the first planar shield is proximate the first surface of the device, the second planar shield is proximate the second surface of the device, and wherein the first and second planar shields are both oriented normal to the component of the magnetic field; a first thermally conductive lead that is thermally coupled to a point proximate the perimeter of the first planar shield and operable to thermally couple to a cold surface; and a second thermally conductive lead that is thermally coupled to a point proximate the perimeter of the second planar shield and operable to thermally couple to the cold surface. The point proximate the perimeter of the first planar shield may be aligned with the point proximate the perimeter of the second planar shield. The first and second planar shields may be positioned such that the device is proximate a center of the first planar shield and a center of the second planar shield. A shape of the first planar shield may be similar to a shape of the second planar shield. The shape of the first planar shield may be triangular and the shape of the second planar shield may be triangular. The area of the first planar shield may be similar to the area of the second planar shield.

The device may include a material that is superconducting below a critical temperature. The critical temperature of the first planar may be higher than the critical temperature of the device and the critical temperature of the second planar shield may be higher than the critical temperature of the device. The first planar shield and the second planar shield may both be formed of a material selected from the group consisting of: niobium, tin, aluminum, lead, bulk niobium-titanium alloy, or a layer of niobium-titanium alloy deposited onto a substrate. The device may include niobium. The device may be a superconducting chip including a superconducting processor. The superconducting processor may include a superconducting quantum processor. The device may be planar. The device may be parallel to both the first planar shield and the second planar shield.

A separation distance between the first planar shield and the second planar shield may be less than a length of the first planar shield, a width of the first planar shield, a length of the second planar shield, and a width of the second planar shield. The first thermally conductive lead and the second thermally conductive lead may both comprise copper. A respective critical field of each of the first planar shield and the second planar shield may be higher than a maximum magnitude of the magnetic field. The magnetic shielding system may further include a controllable heating device comprising a first heater and a second heater, wherein the first heater is proximate a first end of the first planar shield and the second heater is proximate a first end of the second planar shield. The first end of the first planar shield may be a furthest end from the point proximate the perimeter of the first planar shield at which the first thermally conductive lead is thermally coupled, and the first end of the second planar shield may be a furthest end from the point proximate the perimeter of the second planar shield at which the second thermally conductive lead is thermally coupled.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

FIG. 5A is an exemplary plot of the temperature along a line bisecting a planar shield from FIG. 4.

FIG. 5B is a plot of the temperature gradient of FIG. 5A.

DETAILED DESCRIPTION

Figure 1:
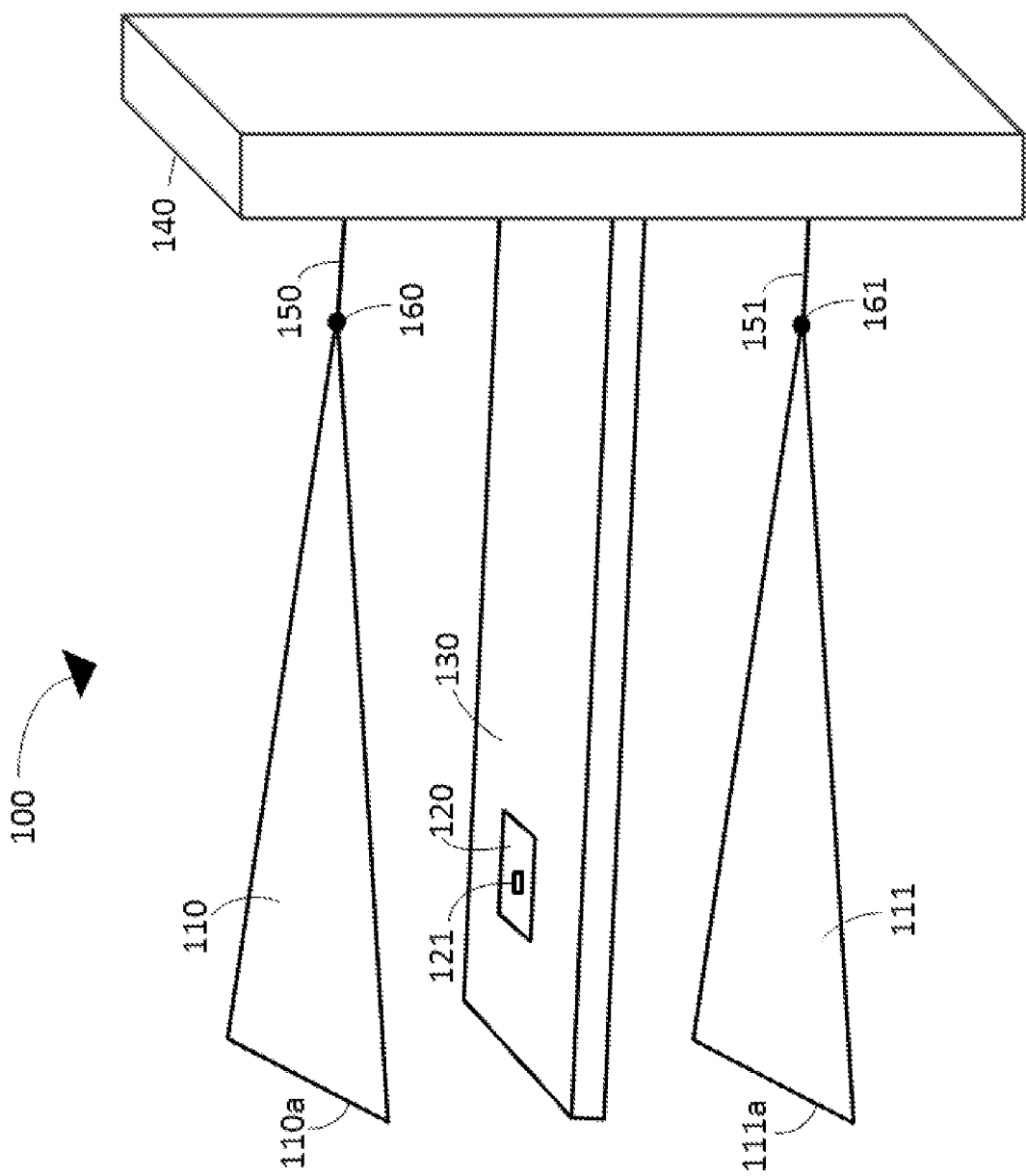
FIG. 1 is a perspective view of a magnetic shielding system that implements a device enclosed by two planar shields in accordance with the present systems, methods and apparatus.

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with electronics systems, such as power supplies, signal generators, and control systems including microprocessors and drive circuitry have not been shown or described in detail to avoid unnecessarily obscuring descriptions of the embodiments of the present systems and methods.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment," or "an embodiment," or "another embodiment" means that a particular referent feature, structure, or characteristic described in connection with the embodiment is included in at least one embodiment. Thus, the appearances of the phrases "in one embodiment," or "in an embodiment," or "another embodiment" in various places throughout this specification are not necessarily all referring to the same embodiment. Furthermore, the particular features, structures, or characteristics may be combined in any suitable manner in one or more embodiments.

It should be noted that, as used in this specification and the appended claims, the singular forms "a," "an," and "the" include plural referents unless the content clearly dictates otherwise. Thus, for example, reference to a shielding system including "a magnetic shield" includes a single magnetic shield, or two or more magnetic shields. It should also be noted that the term "or" is generally employed in its sense including "and/or" unless the content clearly dictates otherwise.

The headings provided herein are for convenience only and do not interpret the scope or meaning of the embodiments.

The various embodiments described herein provide systems, methods, and apparatus for achieving low magnetic fields and/or low magnetic field gradients over a particular area or volume. The present systems, methods, and apparatus include both passive and active techniques for reducing a component of a magnetic field and/or a magnetic field gradient in an environment.

A common technique for controlling ambient magnetic fields in a sensitive system is to encase the system in a hollow superconducting cylinder that is closed at one end. The superconducting cylinder may be wrapped by at least one compensation coil. At a temperature above the critical temperature of the superconducting cylinder (that is, while the superconducting cylinder is not behaving as a superconductor), the ambient magnetic field inside the cylinder is monitored with a measurement device, such as for example a magnetometer. A DC-current is passed through the compensation coil(s) to produce a magnetic field that interferes (either destructively or constructively, depending on the desired impact on the system) with the ambient magnetic field measured inside the cylinder. Once the desired magnetic field has been produced and maintained inside the cylinder, the temperature of the system is reduced below the critical temperature of the superconducting cylinder such that the cylinder becomes superconducting. When this occurs, the cylinder may naturally trap the magnetic flux that is being generated by the compensation coil(s), thereby locking the state of the field(s) inside the cylinder and allowing the DC-current being applied to the compensation coil(s) to be switched off. Throughout the remainder of this specification, this technique of implementing compensation coils wrapped around a cylindrical superconducting shield is referred to as "the cylinder approach."

Even with the cylinder approach, the magnetic field cannot to be shielded completely. The uncompensated magnetic field may be dominated by an unavoidable remnant magnetic field sourced in the cylindrical superconducting shield. The present systems, methods and apparatus describe a space-efficient, cost-efficient and flexible technique that may be used instead of or in addition to the cylinder approach to further reduce the ambient magnetic field in a localized environment and improve shielding performance.

Embodiments of the present systems, methods and apparatus implement at least two planar shields that are superconducting at or below a critical temperature. The planar shields may be triangular in shape and oriented normal to the component of a magnetic field that mostly affects the device or system being shielded. Throughout this specification, the term "triangular" is often used to describe the shape of a magnetic shield, e.g., as in "a triangular planar shield." As described in more detail below, a triangular shape may be advantageous for certain applications, but such a shape is used only for exemplary purposes herein and the present systems, methods and apparatus may employ any shape of magnetic shield, such as rectangular, square, circular, hexagonal, etc. Furthermore, the term "triangular" itself is used loosely to describe an "at least approximately triangular" geometry having three sides and may employ, for example, sharp or rounded corners, straight or curved edges, etc. Similarly, the term "planar" is used throughout this specification and the appended claims to generally describe an object, e.g., "a planar shield" having a substantially flat surface in a two-dimensional plane and a length and a width in the two-dimensional plane that are each, respectively, greater than a thickness of the object in a third dimension perpendicular to the two-dimensional plane. The term "planar" is used loosely to describe an "at least approximately planar" geometry and may employ, for example, a surface having contours, surface textures, a slight curvature, etc.

FIG. 1 is a perspective view of a magnetic shielding system 100 in accordance with the present systems, methods and apparatus. Magnetic shielding system 100 employs two planar shields 110 and 111, each of which is made of superconducting material such as niobium, aluminum, tin, lead, or a superconducting alloy, such as NbTi. Magnetic shielding system 100 may be employed to shield a particular device, such as a superconducting chip 120. Superconducting chip 120 may be, for example, a superconducting processor chip such as a superconducting quantum processor chip. Planar shields 110 and 111 may shield superconducting chip 120 from a magnetic field, and may be oriented normal to the component of the magnetic field that has the largest effect on superconducting chip 120. For example, as illustrated in FIG. 1, superconducting chip 120 may be a planar device and thus the component of the magnetic field that is normal to the planar surface of superconducting chip 120 may be the component of the magnetic field that has the largest effect on superconducting chip 120. When planar shields 110 and 111 are superconducting, any magnetic field that impinges on planar shields 110 and 111 may bend around planar shields 110 and 111 (e.g., in accordance with the Meissner Effect) rather than flowing straight through. Planar shield 110 is positioned proximate a first surface of superconducting chip 120 and planar shield 111 is positioned proximate a second surface of superconducting chip 120, where the second surface of superconducting chip 120 is opposite the first surface of superconducting chip 120, thereby sandwiching superconducting chip 120. Thus, an impinging magnetic field that bends around planar shields 110 and 111 may also bend around superconducting chip 120. Planar shield 110 may have an area similar to the area of planar shield 111, whereas superconducting chip 120 may have an area no bigger than that of planar shields 110 and 111.

The shielding effect described above (i.e., based on the Meissner Effect) is a passive form of magnetic shielding. Despite the implementation of passive magnetic shielding systems, it can be extremely difficult to reduce magnetic fields below a certain point (e.g., to the range of nanoTeslas). In applications where extremely low fields (e.g., on the order of nanoTeslas or less) are desired, such as in a system employing a superconducting quantum processor chip, it can be advantageous to introduce a mechanism for dealing with unwanted magnetic fields that cannot be completely shielded by passive means. In the case of a superconducting quantum processor chip, unwanted magnetic fields may manifest themselves as unwanted magnetic flux (i.e., "fluxons") trapped within at least some of the superconducting devices on the chip. In U.S. Pat. No. 7,687,938, an on-chip superconducting plane is used to passively shield on-chip devices from unwanted magnetic fields originating from either on or off the chip. In US Patent Publication 2011-0237442, trapped fluxons are also moved by introducing a preferential flux gradient and/or a temperature gradient.

Planar shields 110 and 111 are each thermalized at a respective point on or near their perimeter by a cold surface 140 (which is elsewhere thermally coupled to a cold source, such as a cryogenic refrigeration system—not shown) via thermally conductive leads 150 and 151 respectively. Thermally conductive leads 150 and 151 and cold surface 140 may be made from thermally conductive material such as copper, brass, gold-plated copper, or gold-plated brass. As system 100 is cooled, planar shields 110 and 111 become superconducting at regions thereof that are at or below the critical temperature of the material from which planar shields 110 and 111 are formed. Points 160 and 161 where planar shields 110 and 111 make contact with thermally conductive leads 150 and 151, respectively, (hereafter the "thermalizing points") become superconducting first because these are the points from which planar shields 110 and 111 are cooled. The "superconductivity" then spreads across planar shields 110 and 111 away from thermalizing points 160 and 161 as the rest of their respective volumes cool below their critical temperature. The planarity of planar shields 110 and 111 enables smooth transition of temperature along their respective volumes away from thermalizing points 160 and 161. This transition pattern creates a preferential gradient for magnetic flux away from thermalizing points 160 and 161, towards edge 110*a* of planar shield 110 and towards edge 111*a* of planar shield 111 which are furthest from thermalizing point 160 and 161 respectively. Thus, the controlled cooling of planar shields 110 and 111 naturally expels magnetic flux away from superconducting chip 120, thereby reducing trapped magnetic fluxons in superconducting chip 120. Superconducting chip 120 may be mounted on a sample holder 130 which is thermally coupled to cold surface 140. Thus, sample holder 130 may also be made from a thermally conductive material such as copper, gold, gold-plated copper, or gold-plated brass. When sample holder 130 cools, superconducting chip 120 cools and becomes superconducting as the temperature of chip 120 drops below its critical temperature. Magnetic fields in the vicinity of chip 120 may be measured using a magnetometer 121. In system 100, planar shields 110 and 111 are aligned one above the other. However, in practice the entire system may be rotated such that shields 110 and 111 are beside rather than above and below superconducting chip 120. Thermally conductive lead 150 is connected to thermalizing point 160 on or near the perimeter of planar shield 110 and thermally conductive lead 151 is connected to thermalizing point 161 on or near the perimeter of planar shield 111 such that thermalizing points 160 and 161 are substantially aligned one on top of the other. Those of skill in the art will appreciate that planar shields 110 and 111, and their respective thermalizing points 160 and 161, need not be aligned precisely as illustrated in FIG. 1. However, aligning respective thermalizing points 160 and 161 of planar shields 110 and 111 enables planar shields 110 and 111 to cool and become superconducting in substantially the same direction, thereby minimizing the magnetic field intensity at the transition boundary as it spreads across the respective surfaces of planar shields 110 and 111 during cooling through their respective critical temperatures.

Throughout this specification the term "thermalizing point" is used to describe the point where each thermally conductive lead is connected to their respective planar shields. Planar shields 110 and 111 are each illustrated as being triangular in shape, though as described above any alternative shape may similarly be employed in accordance with the present systems, methods, and apparatus. In some applications, employing triangular planar shields may be advantageous because the triangular shape provides a negative resistance gradient from a first "thermalized corner" (i.e., a thermalizing point located at or near a corner of the triangular planar shield, such as thermalizing points 160 and 161 in the Figure) to the opposing edge (i.e., an edge furthest from the thermalizing point) in order to provide a sufficient temperature gradient for improving the chances of a successful progression of expulsion of magnetic field along the cooling path during cooling through the critical temperature of planar shields 110 and 111 by cold surface 140.

Planar shields 110 and 111 may, for example, each have a critical temperature higher than that of superconducting chip 120 so that a magnetic field is substantially expelled from the region in which superconducting chip 120 is located before chip 120 is cooled through its critical temperature. Superconducting chip 120 may, for example, be made from materials such as Al and/or Nb and each of planar shields 110 and 111 may, for example, consist of a bulk sheet of NbTi or a thin layer of NbTi deposited onto a substrate. The NbTi layer's thickness may be adjusted/formed to achieve a desired thermal resistance per unit length from the respective thermalized corner of each of planar shields 110 and 111 to their respective opposite edge. Together with the heat capacitance per unit length of the substrate, the total heat capacitance per unit length may passively provide for a sufficient/optimized temperature gradient for a successful progression of magnetic field expulsion away from the respective thermalizing point of each of planar shields 110 and 111 while cooling through their respective critical temperatures without the need for controlled heating.

Planar shields 110 and 111 may, for example, each have the same or a lower critical temperature than superconducting chip 120. The sample holder 130 which holds superconducting chip 120 and cools superconducting chip 120 may be thermally coupled to a first cold surface 140 that is cooled by a first cooling device (e.g., a first stage of a first cryogenic refrigeration system, not shown), but planar shields 110 and 111 may be thermally coupled to a second cold surface (not shown) that is itself thermally coupled to a second cooling device (e.g., a second stage of the first cryogenic refrigeration system, or a second cryogenic refrigeration system, not shown). The second cooling device may be operated to cool the second cold surface faster or before the first cooling device cools the first cold surface 140, thereby enabling planar shields 110 and 111 to cool through their respective critical temperatures before superconducting chip 120 cools through its critical temperature. In this exemplary configuration, planar shields 110 and 111 may be made from the same material as superconducting chip 120 or any other suitable material or a combination of materials that have the same critical temperature as superconducting chip 120 or a critical temperature lower than that of superconducting chip 120, provided the planar shields 110 and 111 cool through their respective critical temperatures and become superconducting before superconducting chip 120.

The maximum field that can be applied to a superconductor at a particular temperature while still permitting the superconductor to maintain its superconductivity is the maximum critical field of that superconductor. In accordance with the present systems, methods and apparatus, the maximum critical field of planar shields 110 and 111 may be larger than the background/ambient field. In order to facilitate this, the various embodiments of magnetic shielding systems described herein may be combined with other magnetic shielding systems to ensure the background/ambient field is lower than the maximum critical field of planar shields 110 and 111. As previously described, thermalizing points 160 and 161 of respective planar shields 110 and 111 may be aligned so that planar shields 110 and 111 may cool and become superconducting at least approximately simultaneously and in substantially the same direction, thereby minimizing the magnetic field intensity at the transition boundary as it spreads across the respective surfaces of planar shields 110 and 111 during cooling through their respective critical temperatures. In this way, magnetic flux is expelled or pushed by the transition boundary towards the respective edge 110a and 111a of each of planar shields 110 and 111 that is opposite the respective thermalizing corner. Edge 110a of planar shield 110 is opposite (i.e., further away from) thermalizing point 160 and edge 111a of planar shield 111 is opposite (i.e., furthest away from) thermalizing point 161. However, such may cause magnetic flux to accumulate at respective edges 110a and 111a of each of planar shields 110 and 111, which could produce a localized magnetic field that exceeds the maximum critical field of planar shield 110 and/or planar shield 111. Thus, employing other magnetic shielding systems (i.e., the cylinder approach) to minimize the ambient magnetic field may help to ensure that the accumulated magnetic flux does not amount to a magnetic field exceeding the maximum critical field of planar shields 110 and 111.

The separation distance between planar shields 110 and 111 and superconducting chip 120 has been enlarged in FIG. 1 to reduce clutter. In accordance with the present systems, methods and apparatus the shielding provided by magnetic shielding system 100 may be improved by positioning planar shields 110 and 111 as close as possible to superconducting chip 120 while not touching any of superconducting chip 120 or sample holder 130. For example, the separation distance between planar shields 110 and 111 may be less than the length of each shield 110 and 111 as well as the width of each shield 110 and 111. If planar shields 110 and 111 had a larger separation distance, depending on the direction of the magnetic field, either the magnetic field that bends around shield 110 may tend to flow through superconducting chip 120 before it bends around shield 111 or the magnetic field that bends around shield 111 may tend to flow through superconducting chip 120 before it bends around shield 110. By placing the sheets as close as possible, depending on the direction, either the magnetic field that bends around shield 110 may be forced to bend around shield 111 immediately after thereby preventing the magnetic field that was bent around shield 110 from flowing through superconducting chip 120, or the magnetic field that bends around shield 111 may be forced to bend around shield 110 immediately after thereby preventing the magnetic field that was bent around shield 111 from flowing through superconducting chip 120.

Throughout the remainder of this specification, various embodiments of the present systems, methods and apparatus are described that use a superconducting processor chip to represent a system for which magnetic shielding is desired. While the present systems, method and apparatus are well-suited for shielding a superconducting processor chip, those of skill in the art will appreciate that other embodiments may be used to shield systems other than superconducting processor chips.

By using system 100, magnetic field present in the local environment of superconducting chip 120 (for example, the magnetic field flowing normal to superconducting chip 120) may be reduced to a level that enables and/or improves the operation of superconducting chip 120. In some applications, system 100 may be particularly well-suited to reduce a specific component of a magnetic field, such as the component of the magnetic field that is normal to planar shields 110 and 111 and, for example, also normal to superconducting chip 120. As previously discussed, those of skill in the art will appreciate that planar shields 110 and 111 may be triangular in geometry, but need not be triangular in geometry in order to realize at least some of the benefits taught in the present systems, methods and apparatus. Planar shields 110 and 111 may take on any shape defined by a perimeter to encompass any desired planar region; however, in general it is advantageous to ensure that planar shields 110 and 111 are both larger in planar area than the planar area of superconducting chip 120 so that the planar area of superconducting chip 120 is completely covered by planar shields 110 and 111 which lie parallel to the plane of superconducting chip 120.

Figure 2:
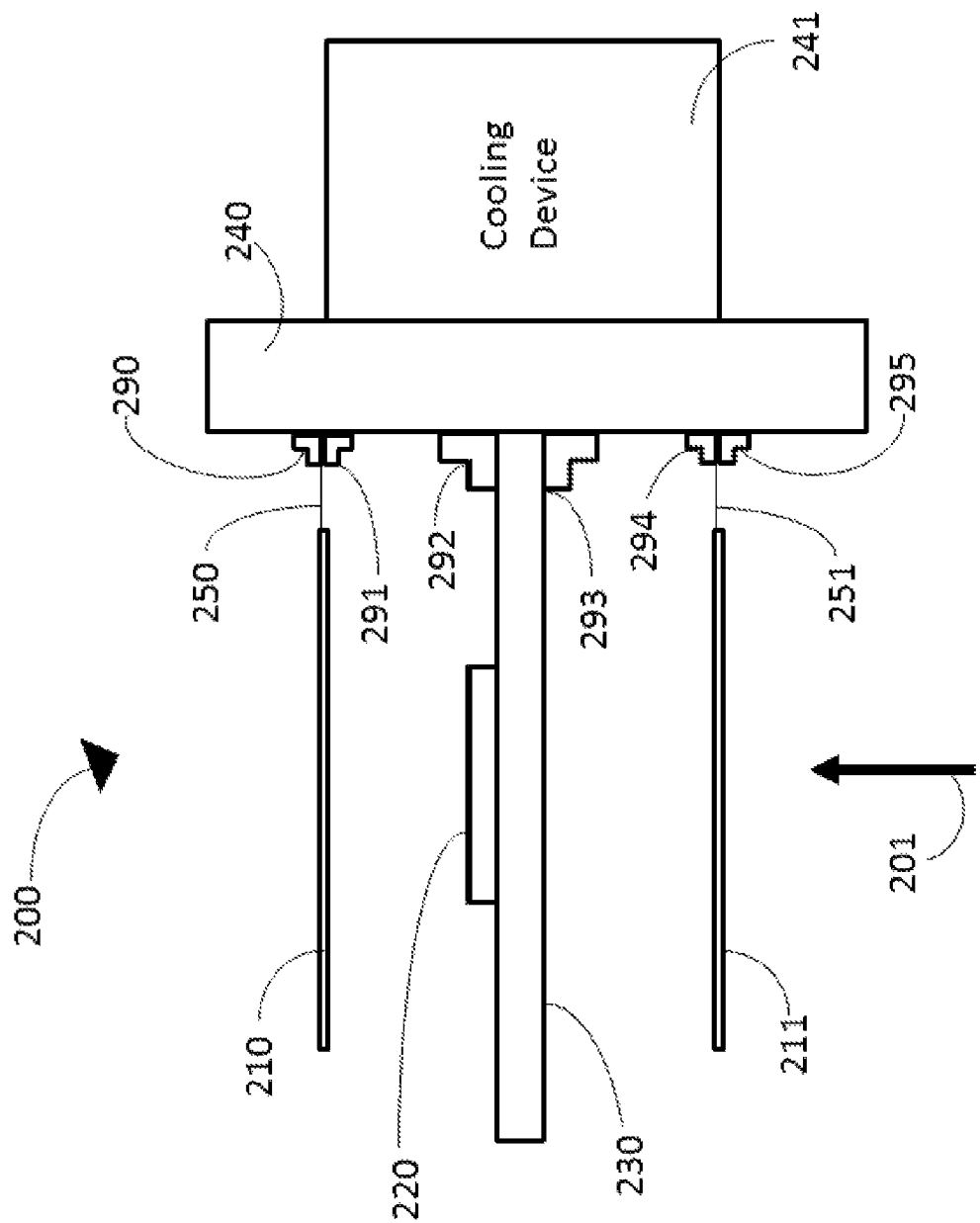
FIG. 2 is a side view of a magnetic shielding system in accordance with the present systems, methods and apparatus.

FIG. 2 is a side view of a magnetic shielding system 200 employing planar shields 210 and 211 in accordance with the present systems, methods and apparatus. System 200 functions in a similar way to system 100, except that system 200 clearly shows the way in which planar shields 210 and 211, a superconducting chip 220 and a sample holder 230 are attached to a cold surface 240.

Thermally conductive leads 250 and 251 thermally couple planar shields 210 and 211, respectively, to cold surface 240 and may be, for example, soldered to respective surfaces of planar shields 210 and 211. Those of skill in the art will appreciate that thermally conductive leads 250 and 251 may be attached to planar shields 210 and 211 in many alternative ways, such as by bolting or epoxy gluing. Non-superconducting solder may be used, since the purpose here is thermal conduction rather than electrical, and the solder provides a nice large contact surface area between the led and the shield. Conductive lead 250 is clamped to cold surface 240 with clamps 290 and 291. Conductive lead 251 is clamped to cold surface 240 with clamps 294 and 295. Sample holder 230 is clamped to cold surface 240 with clamps 292 and 293. Superconducting chip 220 is mounted on sample holder 230 with electrical wirebonds (not shown). Cold surface 240 is attached to cooling device 241 which serves as the source of the cooling power in magnetic shielding system 200. The direction of the component of the magnetic field that may have the most effect on superconducting chip 220 is shown by arrow 201, which a person of skill in the art will appreciate is normal to the planar surface of chip 220.

Unlike the previously described "cylinder approach", the present systems, methods and apparatus may easily be heated to further help minimize the chance of trapping flux as shields 210 and 211 cool through their respective critical temperatures and help control the expulsion of magnetic flux away from the thermalizing points by actively steepening the temperature gradient. This capability may be desired to accommodate irregularities on the surface of planar shields 210 and 211 that can lead to a not-so-smooth transition of temperature gradient away from the thermalizing points of planar shields 210 and 211 that can ultimately result in trapped/pinned flux.

Figure 3:
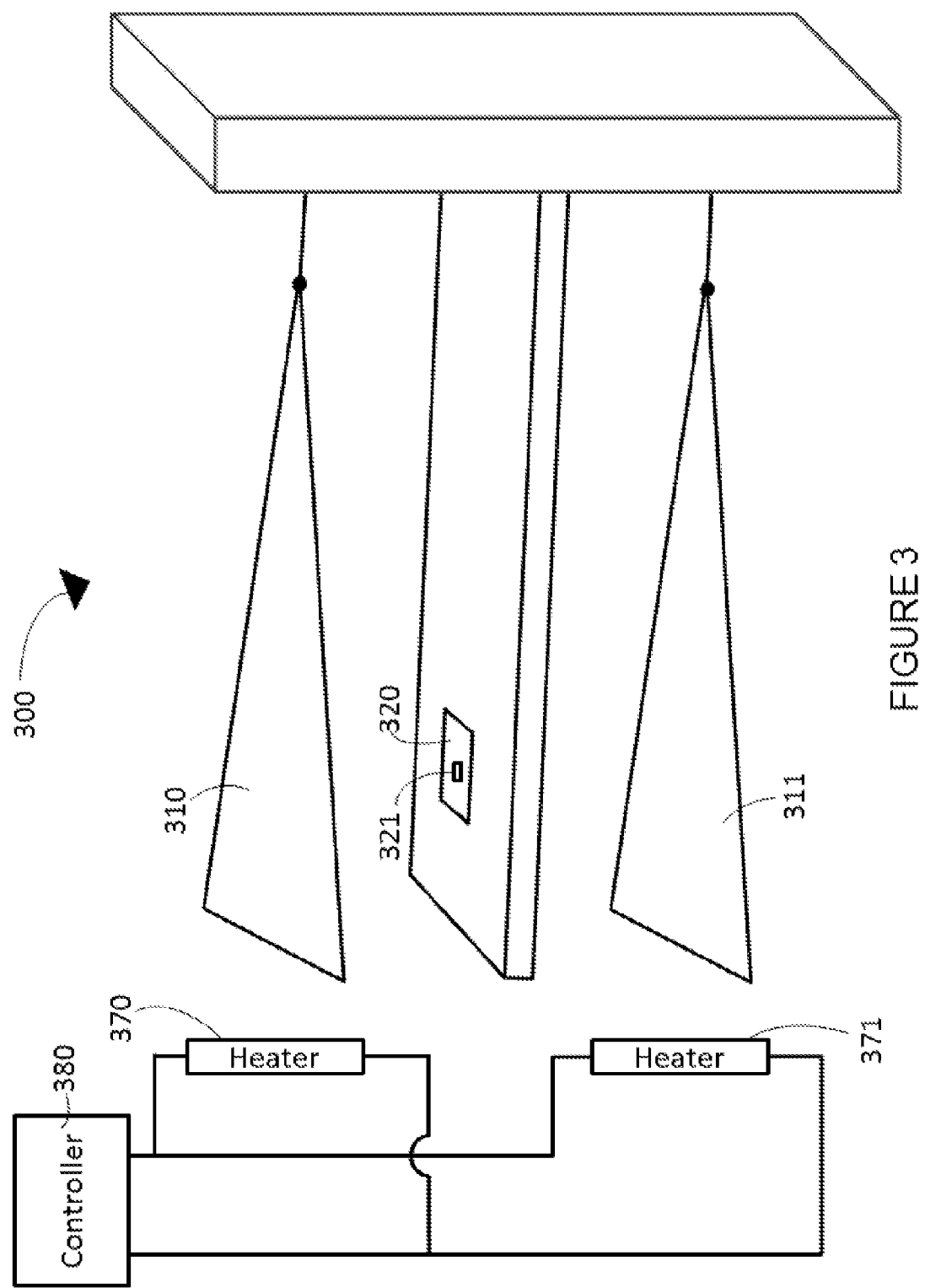
FIG. 3 is a schematic diagram of a magnetic shielding system that includes 2 controllable heaters operable to further reduce magnetic fields trapped in the planar shields by actively steepening the temperature gradient.

FIG. 3 shows a magnetic shielding system 300 that includes controllable heating elements 370 and 371 to further help minimize the chance of trapping flux as planar shields 310 and 311 cool through their respective critical temperatures and help control the expulsion of magnetic flux away from the thermalizing points by actively steepening the temperature gradient. System 300 functions in a similar way to system 100 from FIG. 1 and system 200 from FIG. 2, except that system 300 includes heating elements 370 and 371 (hereafter, "heaters") which may be coupled to a controller 380. Controller 380 may, for example, be controlled by an electrical current. Heaters 370 and 371 may be integrated into system 300 to heat planar shields 310 and 311, respectively. Once the desired level of expulsion of the magnetic field has been achieved by planar shields 310 and 311, heaters 370 and 371 may be deactivated. This process can be repeated with varying heater settings to optimize the results. The magnetic fields may be measured using magnetometer 321. Those of skill in the art will appreciate that heaters 370 and 371 may be realized by a variety of hardware devices, including but not limited to resistors conductively or radiatively coupled to planar shields 310 and 311 or light-emitting diodes projecting photons onto the surfaces of planar shields 310 and 311. The purpose of heaters 370 and 371 is to control the thermal gradient across planar shields 310 and 311 and thereby control the expulsion of magnetic flux from superconducting chip 320, as illustrated in FIG. 4.

Figure 4:
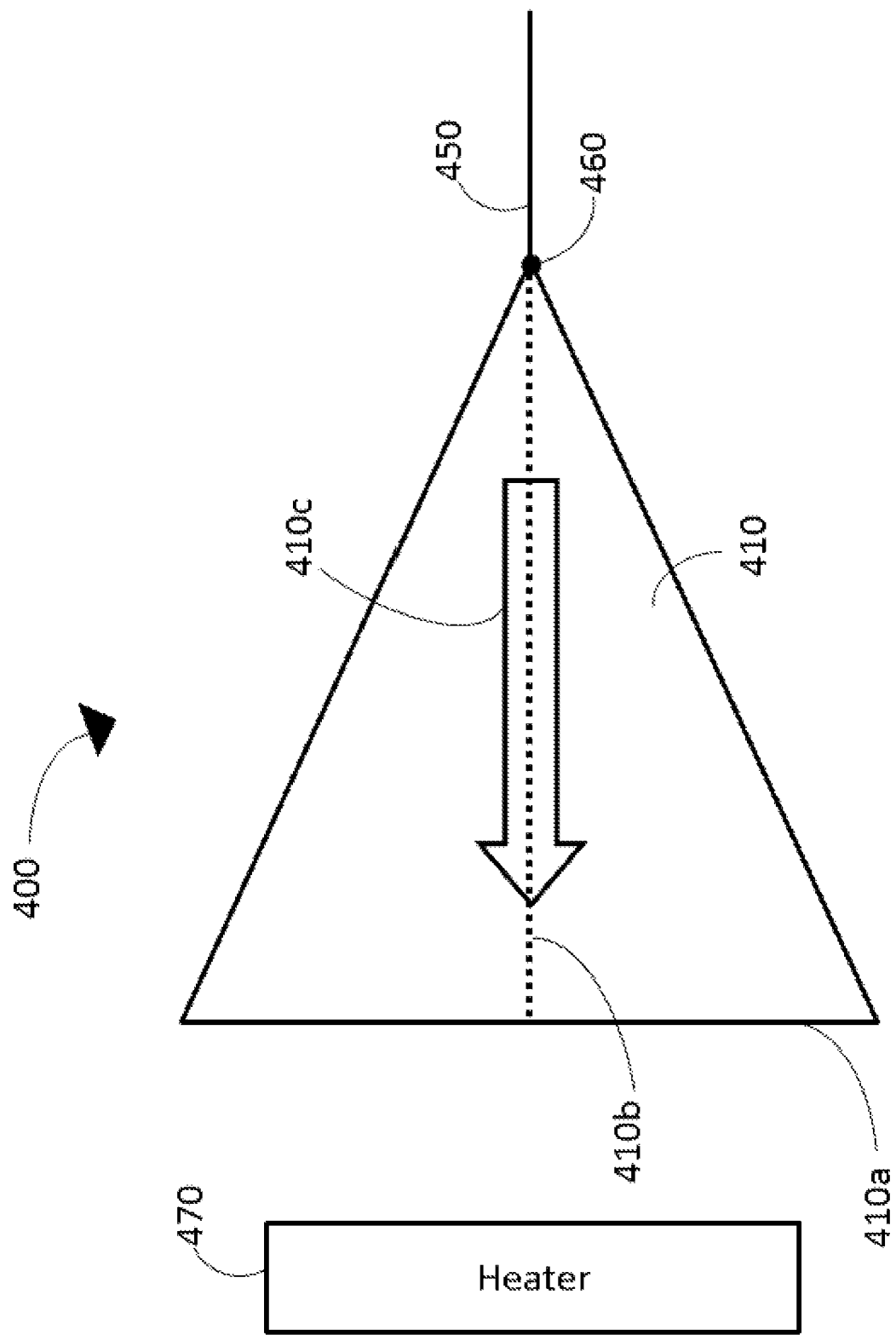
FIG. 4 is a top view of a magnetic shielding system showing a controlled temperature gradient of a planar shield in accordance with the present systems, methods and apparatus.

FIG. 4 is a top view of a magnetic shielding system 400 showing a controlled temperature gradient (represented by arrow 410c) of a planar shield 410 in accordance with the present systems, methods and apparatus. Arrow 410c indicates the direction of the temperature gradient from cold to warm across planar shield 410 (which is analogous to, e.g., planar shield 310 or 311 from FIG. 3, planar shield 210 or 211 from FIG. 2, and/or planar shield 110 or 111 from FIG. 1) with a thermally conductive lead 450 attached to a corner of shield 410 at thermalizing point 460 to cool shield 410 and a heater 470 integrated into system 400 to supply a constant temperature along edge 410a of shield 410. Thermally conductive lead 450 may be elsewhere attached to a cold surface (not shown) which may be thermally coupled to a cooling device (not shown) such as a cryogenic refrigeration system. Heater 470 may be coupled to a controller (not shown) that is controlled by an electrical current.

FIG. 5A shows an exemplary plot 500a of the temperature along dotted line 410b bisecting planar shield 410 from FIG. 4. The x-axis in FIG. 5A indicates the position along line 410b (from left to right) and the y-axis in FIG. 5A indicates the corresponding temperature at each position along line 410b. The values of both x- and y-axes in FIG. 5A may depend on the actual physical parameters of the magnetic shielding system being implemented. The purpose of FIG. 5A is to show the general shape of line 590a representing the temperature profile along line 410b from FIG. 4, i.e., that the temperature of planar shield 400 increases along line 410b in a direction from right to left (or, alternatively, decreases along line 410b in a direction from left to right). Planar shield 410 in FIG. 4 is at an instance of the cooling process, the cooling provided by thermally conductive lead 450 at thermalizing point 460, with controlled heating provided by heater 470 at edge/end 410a which is furthest from thermalizing point 460 (i.e., controlled heating at the left of FIG. 5A and controllable cooling at the right of FIG. 5A). As seen in FIG. 5A, the temperature of planar shield 410 is lowest at thermalizing point 460 and the temperature gradually increases towards edge 410a. Therefore, thermalizing point 460 of planar shield 410 will transition through the critical temperature and become superconducting before edge 410a of planar shield 410. The "superconductivity" may then gradually spread over to edge 410a as the rest of planar shield 410 cools through its critical temperature. Those of skill in the art will appreciate that irregularities on the surface of planar shield 410 may hinder the smooth progression of superconductivity along the length of planar shield 410. FIG. 5A is given as an example only to show the temperature along shield 410 at a specific instance. The shape of plot 500a may be different at different instances of the cooling and heating process of shield 410.

FIG. 5B shows plot 500b of the temperature gradient of FIG. 5A which shows the temperature along dotted line 410b from FIG. 4. The x-axis in FIG. 5B indicates the position along line 410b (from left to right) and the y-axis in FIG. 5B indicates the corresponding temperature gradient at each position along line 410b. The values of both x- and y-axes in FIG. 5B may depend on the actual physical parameters of the magnetic shielding system being implemented. The purpose of FIG. 5B is to show the general shape of line 590b representing the temperature gradient along line 410b from FIG. 4, taken at the same instance as FIG. 5A, i.e., that the temperature gradient of planar shield 410 increases along line 410b in a direction from left to right (or, alternatively, decreases along line 410b in a direction from right to left). The planar shield 410 in FIG. 4 is at a specific instance of the cooling process with controlled heating at edge/end 410a which is furthest from thermalizing point 460 (i.e., controlled heating at the left of FIG. 5B and controlled cooling at the right of FIG. 5B). The steep slope of line 590b to the right along the x-axis of FIG. 5B indicates that the temperature of planar shield 400 is rapidly changing around thermalizing point 460. The change in temperature may tend to decrease towards edge 410a, as indicated by the reduction in slope, or leveling off, of line 590b to the left along the x-axis. For some applications, it may be important to achieve a smooth temperature gradient as shown in FIG. 5B as otherwise planar shield 410 may trap the unwanted magnetic field. The shape of plot 500b may be different at different instances of the cooling and heating process of shield 410.

Certain aspects of the present systems and methods may be realized at room temperature, and certain aspects may be realized at a superconducting temperature. Thus, throughout this specification and the appended claims, the term "superconducting" when used to describe a physical structure such as a "superconducting sheet" or a "superconducting chip" is used to indicate a material that is capable of behaving as a superconductor at an appropriate temperature. A superconducting material may not necessarily be acting as a superconductor at all times in all embodiments of the present systems, methods and apparatus. As previously described, the planar shields (e.g., shields 110 and 111) may each have an area larger than the superconducting chip (e.g., chip 120) or any other device being shielded, and one planar shield (e.g., shield 110) may be positioned proximate a first surface of the superconducting chip while the other planar shield (e.g., shield 111) may be positioned proximate a second surface of the superconducting chip, where the second surface of the superconducting chip is opposite the first surface of the superconducting chip, thereby sandwiching the superconducting chip. Throughout this specification and the appended claims, the phrase "area of the planar shield(s)" or "planar area of the shield(s)" refers to the area taken along the two largest dimensions spanned by the planar shield (e.g., the length and width of the shield in the two-dimensional plane in which the shield lies, as opposed to the thickness of the shield) that may form a plane parallel to the plane of the superconducting chip.

The two planar shields may be similar in shape and area. Those of skill in the art will appreciate that the term "similar shape" is used to generally encompass implementations in which the shape of one planar shield may be slightly different from the shape of the other planar shield and the term "similar area" is used to generally encompass implementations in which the area of one planar shield may be slightly different from the area of the other planar shield. As long as the two planar shields completely cover the planar area of the superconducting chip so that the shields may shield the superconducting chip from the component of the magnetic field that is normal to the superconducting chip plane and the planar shields expel flux away from the superconducting chip, the planar shields may have any area and any shape.

The planar shields may be positioned parallel to each other as well as to the device being shielded (i.e., if the device itself is planar, as in the case of a superconducting chip). Those of skill in the art will appreciate that the term "parallel" is used loosely in this context and the planar shields and the device being shielded may be slightly off-parallel.

A planar shield may be formed from a single continuous sheet of superconducting material or from multiple discontinuous sheets of superconducting material that are thermally and/or electrically connected together to form a single superconducting sheet.

The various embodiments described herein may be combined with other forms of magnetic shielding systems, including but not limited to the cylindrical approach to magnetic shielding.

At least one planar shield may be physically coupled to a superconducting processor chip, though preferably through a thermally insulative material.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other systems, methods and apparatus, not necessarily the exemplary systems, methods and apparatus generally described above.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A superconducting magnetic shielding system operable to shield a device from a component of a magnetic field, the device having at least a first surface and a second surface that is opposite the first surface, the system comprising:
   a first planar shield formed of a material that is superconducting below a critical temperature, the first planar shield defined by a perimeter and an area that is larger than an area of the device;
   a second planar shield formed of a material that is superconducting below a critical temperature, the second planar shield defined by a perimeter and an area that is larger than the area of the device, wherein the first planar shield and the second planar shield are parallel with one another, the first planar shield is proximate the first surface of the device, the second planar shield is proximate the second surface of the device, and wherein the first and second planar shields are both oriented normal to the component of the magnetic field;
   a first thermally conductive lead that is thermally coupled to a point proximate the perimeter of the first planar shield and operable to thermally couple to a cold surface; and
   a second thermally conductive lead that is thermally coupled to a point proximate the perimeter of the second planar shield and operable to thermally couple to the cold surface.

2. The magnetic shielding system of claim 1 wherein the point proximate the perimeter of the first planar shield is aligned with the point proximate the perimeter of the second planar shield.

3. The magnetic shielding system of claim 1 wherein the first and second planar shields are positioned such that the device is proximate a center of the first planar shield and a center of the second planar shield.

4. The magnetic shielding system of claim 1 wherein a shape of the first planar shield is similar to a shape of the second planar shield.

5. The magnetic shielding system of claim 4 wherein the shape of the first planar shield is triangular and the shape of the second planar shield is triangular.

6. The magnetic shielding system of claim 4 wherein the area of the first planar shield is similar to the area of the second planar shield.

7. The magnetic shielding system of claim 1 wherein the device includes a material that is superconducting below a critical temperature.

8. The magnetic shielding system of claim 7 wherein the critical temperature of the first planar shield is higher than the critical temperature of the device and the critical temperature of the second planar shield is higher than the critical temperature of the device.

9. The magnetic shielding system of claim 8 wherein the first planar shield and the second planar shield are both formed of a material selected from the group consisting of: niobium, tin, aluminum, lead, bulk niobium-titanium alloy, or a layer of niobium-titanium alloy deposited onto a substrate.

10. The magnetic shielding system of claim 7 wherein the device includes niobium.

11. The magnetic shielding system of claim 7 wherein the device is a superconducting chip including a superconducting processor.

12. The magnetic shielding system of claim 11 wherein the superconducting processor includes a superconducting quantum processor.

13. The magnetic shielding system of claim 1 wherein the device is planar.

14. The magnetic shielding system of claim 1 wherein the device is parallel to both the first planar shield and the second planar shield.

15. The magnetic shielding system of claim 14 wherein a separation distance between the first planar shield and the second planar shield is less than a length of the first planar shield, a width of the first planar shield, a length of the second planar shield, and a width of the second planar shield.

16. The magnetic shielding system of claim 1 wherein the first thermally conductive lead and the second thermally conductive lead both comprise copper.

17. The magnetic shielding system of claim 1 wherein a respective critical field of each of the first planar shield and the second planar shield is higher than a maximum magnitude of the magnetic field.

18. The magnetic shielding system of claim 1, further comprising:
  a controllable heating device comprising a first heater and a second heater, wherein the first heater is proximate a first end of the first planar shield and the second heater is proximate a first end of the second planar shield.

19. The magnetic shielding system of claim 18, wherein the first end of the first planar shield is a furthest end from the point proximate the perimeter of the first planar shield at which the first thermally conductive lead is thermally coupled, and wherein the first end of the second planar shield is a furthest end from the point proximate the perimeter of the second planar shield at which the second thermally conductive lead is thermally coupled.

* * * * *